(12) United States Patent
Lee et al.

(10) Patent No.: US 6,313,503 B1
(45) Date of Patent: Nov. 6, 2001

(54) MNOS-TYPE MEMORY USING SINGLE ELECTRON TRANSISTOR AND DRIVING METHOD THEREOF

(75) Inventors: Jo-won Lee, Suwon; Moon-kyung Kim, Seoul; Byong-man Kim, Kunpo; Seok-yeol Yoon, Seoul; Hyung-lae Roh, Seongnam, all of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/599,225

(22) Filed: Jun. 22, 2000

(30) Foreign Application Priority Data

Aug. 11, 1999 (KR) .................................................. 99-32906

(51) Int. Cl.$^7$ .................................................. H01L 29/792
(52) U.S. Cl. .......................... 257/324; 257/327; 257/412
(58) Field of Search ............................................... 257/324

(56) References Cited

U.S. PATENT DOCUMENTS

| | | | |
|---|---|---|---|
| 4,145,233 | * 3/1979 | Sefick et al. | 257/324 |
| 4,212,683 | * 7/1980 | Junes et al. | 257/324 |
| 5,436,481 | * 7/1995 | Egawa et al. | 257/324 |
| 5,600,163 | 2/1997 | Yano et al. | 257/314 |
| 5,714,766 | 2/1998 | Chen et al. | 257/17 |
| 5,801,401 | 9/1998 | Forbes | 257/314 |

OTHER PUBLICATIONS

Anri Nakajima, et al., "Si Single Electron Tunneling Transistor With Nanoscale Floating Dot Stacked On A Coulomb Island By Self–Aligned Process," Appl. Phys. Lett. 71 (3), Jul. 21, 1997, pp. 353–355.

C.D. Chen, et al., "Aluminum Single–Electron Nonvolatile Floating Gate Memory Cell," Appl. Phys. Lett. 71 (14), Oct. 6, 1997, pp. 2038–2040.

Y. Takahashi, et al., "Si Memory Device Operated With A Small Number Of Electrons By Using A Single–Electron–Transistor Detector," Electronics Letters, vol. 34, No. 1, Jan. 8, 1998, pp. 45–46.

L. Guo, et al., "A Silicon Single–Electron Transistor Memory Operating At Room Temperature," Science, vol. 275, Jan. 31, 1997, pp. 649–651.

* cited by examiner

*Primary Examiner*—Gene M. Munson
(74) *Attorney, Agent, or Firm*—Burns, Doane, Swecker & Mathis, L.L.P.

(57) ABSTRACT

A metal nitride oxide semiconductor (MNOS) type memory using a threshold voltage variation ($\Delta V_{th}$) due to charging of a single electron when the width of a channel of the memory is set to be smaller than or equal to the Debye screen length (LD) of an electron, and a driving method thereof, are provided. The MNOS memory uses a threshold voltage variation ($\Delta V_{th}$) due to charging of a single electron occurring when the width of a channel is set to be smaller than or equal to the Debye screen length (LD) which depends on the impurity concentration of a semiconductor substrate.

30 Claims, 3 Drawing Sheets

MNOS-TYPE MEMORY USING SINGLE ELECTRON TRANSISTOR AND DRIVING METHOD THEREOF

This application claims priority under 35 U.S.C. §§119 and/or 365 to 99-32906 filed in Korea on Aug. 11, 1999; the entire content of which is hereby incorporated by reference.

BACKGROUND OF THE INVENTION

1. Field of the Invention

The present invention relates to a metal nitride oxide semiconductor (MNOS) type memory using a threshold voltage variation ($\Delta$Vth) due to charging of a single electron which occurs when the width of a channel of a memory is set to be smaller than or equal to the Debye screen length (LD) of an electron, and a driving method thereof.

2. Description of the Related Art

Non-volatile MNOS-type memories in the present invention indicate MNOS memories and metal oxide nitride oxide semiconductor (MONOS) memories.

FIG. 1A is a schematic cross-sectional view of an MNOS memory representative of conventional non-volatile memory. As shown in FIG. 1A, in the conventional MNOS memory, a source 12 and a drain 13, which are doped with $n^+$, are formed on a p-type semiconductor substrate 10, having a channel 11 of an inversion layer therebetween. A tunnel oxide layer 14 composed of $SiO_2$ and a thin nitride layer 15 composed of $Si_3N_4$ are sequentially formed on the channel 11, and then a gate 16 is stacked on the resultant structure. Trap sites 17, which are charged with electrons, are formed between the tunnel oxide layer 14 and the thin nitride layer 15 stacked between the channel 11 and the gate 16.

The operation characteristics of a non-volatile MNOS memory having such a structure are shown as a current-voltage (I–V) characteristic curve in FIG. 1B. Here, a gate voltage capable of operating memory cells, that is, a threshold voltage, is higher by $\Delta$Vth when electrons are trapped than when no electrons are trapped. In other words, when trap sites are charged with electrons by Fowler-Nordheim tunneling (FNT) or channel hot electron injection (CHEI), the electrons do not leak even if power is turned off. Upon reading, the electrons charged in trap sites screen the channel, causing a variation in the threshold voltage. The charged state and the discharged state described above are designated as 1 and 0, respectively, and non-volatile MNOS memories store the information corresponding to 1 and 0.

Floating gate (FG)-type SET flash memories, which are existing memories using single electron charging, have been studied by many people. Hitachi introduced a 128 M SET flash memory which operates at room temperature (U.S. Pat. No. 5,600,163) early in 1998. IBM has U.S. Pat. Nos. 5,714,766 AND 5,801,401 wherein an enormous number of nano crystals are formed on an existing FET channel, and the resultant structure is applied as a floating gate. Fujitsu in Appl. Phys. Lett Vol 71, p 353, 1997, and Princeton University in Science, Vol 275, p 649, 1997 introduced a non-volatile memory which operates at room temperature using the principle that a single electron can screen a channel by setting the size of a floating gate on an FET to be several nanometers and setting the width of a channel to be smaller than the Debye screen length of an electron. NEC in Appl.Phys.Lett Vol 71, p 2038, 1997, and NTT in Electron.Lett, Vol 34, p 45, 1998 introduced a memory which operates a single electron transistor as an electrometer which indirectly detects the presence of electrons to a precision of a single electron and thus determines whether electrons are stored in a floating gate. However, the SET flash memory of Hitachi has critical drawbacks in that the operating voltage is very high, and nano crystals used for a floating gate and nano crystals applied as a channel cannot be arbitrarily controlled in contrast to other memories. The memory introduced by IBM causes fluctuations in $\Delta$Vth and temperature due to the difficulty in maintaining the sizes of nano crystals, which are applied as a floating gate, to be uniform. The memories introduced by Fujitsu and Princeton University have problems in that it is difficult to commercialize the memories as non-volatile memories since the retention time is only several seconds, and particularly, reproducible and uniform control of a floating gate to have a size of several nanometers cannot be secured. In the memories produced by NEC and NTT, the structure of elements and a fabrication process thereof are very complicated. According to the results of analysis made on the characteristics and realizability of the memory devices proposed up until now, a method of forming a floating gate of numerous nano crystals, which is proposed by IBM, that is, constitution of one bit using more than several tens of electrons, was estimated to provide excellent reliability. Therefore, non-volatile memories which are not limited in size, apply the single electron charging phenomenon, and can operate at a low voltage, are required.

SUMMARY OF THE INVENTION

To solve the above problems, it is an object of the present invention to provide a metal nitride oxide semiconductor (MNOS) type memory using a threshold voltage variation ($\Delta$Vth) due to charging of a single electron which occurs when the width of a channel of a memory is set to be smaller than or equal to the Debye screen length (LD) of an electron, and a driving method thereof.

To achieve the above object, the present invention provides a metal nitride oxide semiconductor (MNOS) memory including: a semiconductor substrate of a first conductivity type; a channel of an inversion layer formed on the semiconductor substrate; a source and a drain which are doped with a second conductivity type and formed on the semiconductor substrate, having the channel therebetween; an oxide layer formed on the channel; a nitride layer formed on the oxide layer; a gate formed on the nitride layer; and trap sites which are formed between the oxide layer and the nitride layer to be charged with electrons one by one, wherein the channel is formed to have a width that is smaller than or equal to the Debye screen length which is expressed by the following equation:

$$L_D = (\in k_B T / q^2 N_A)^{1/2}$$

wherein $\in$ denotes the dielectric constant of the substrate, $k_B$ denotes Boltzmann's constant, T denotes absolute temperature, q denotes charge, and $N_A$ denotes the concentration of impurities in the substrate.

In the present invention, the semiconductor substrate of a first conductivity type is a p-type silicon substrate having an impurity concentration $N_A$ that is within $10^{17}$ to $10^{13}$/cm$^3$, and the second conductive type is an $n^+$ type. The oxide layer is formed of a natural oxide having a thickness of 10 nm or less, a thermal oxide or a high dielectric material having a dielectric constant of 3.5 or more to achieve direct tunneling, Fowler-Nordheim tunneling (FNT) writing or channel hot electron injection (CHEI) writing in order to increase writing speed. The nitride layer is formed to have a thickness of 100 nm or less, or is formed of a dielectric material having a dielectric constant of 3.5 or greater. In particular, it is preferable that a combination of a nitride constituting the nitride layer and an oxide constituting the oxide layer is $Si_3N_4/SiO_2$, $TiO_2/SiO_2$, $Ta_2O_5/SiO_2$, $SiON/SiO_2$, $AlON/SiO_2$, $AlN/SiO_2$, or $Al_2O_3/SiO_2$. Preferably, the gate is formed of Al, W, Co, Ti or polysilicon, and the density of the trap sites is between $10^{10}/cm^2$ and $10^{15}/cm^2$.

To achieve the above object, there is provided a metal oxide nitride oxide semiconductor (MONOS) memory including: a semiconductor substrate of a first conductivity type; a channel of an inversion layer formed on the semiconductor substrate; a source and a drain which are doped with a second conductivity type and formed on the semiconductor substrate, having the channel therebetween; a first oxide layer formed on the channel; a nitride layer formed on the first oxide layer; a second oxide layer formed on the nitride layer; a gate formed on the second oxide layer; and trap sites which are formed between the first oxide layer and the nitride layer to be charged with electrons one by one, wherein the channel is formed to have a width that is smaller than or equal to the Debye screen length which is expressed by the following equation:

$$L_D = (\in k_B T/q^2 N_A)^{1/2}$$

wherein $\in$ denotes the dielectric constant of the substrate, $k_B$ denotes Boltzmann's constant, T denotes absolute temperature, q denotes charge, and $N_A$ denotes the concentration of impurities in the substrate.

In the present invention, the semiconductor substrate of a first conductivity type is a p-type silicon substrate having an impurity concentration $N_A$ that is within $10_{17}$ to $10^{13}/cm^3$, and the second conductive type is an $n_+$ type. The first oxide layer is formed of a natural oxide having a thickness of 10 nm or less, a thermal oxide or a high dielectric material having a dielectric constant of 3.5 or more to achieve direct tunneling, Fowler-Nordheim tunneling (FNT) writing or channel hot electron injection (CHEI) writing in order to increase writing speed. The nitride layer is formed to have a thickness of 100 nm or less, or is formed of a dielectric material having a dielectric constant of 3.5 or greater, in order to reduce power consumption, and the second oxide layer is formed to have a thickness of 100nm or less. In particular, it is preferable that a combination of oxide constituting the first oxide layer, nitride constituting the nitride layer and oxide constituting the second oxide layer is $SiO_2/Si_3N_4/SiO_2$, $SiO_2/TiO_2/SiO_2$, $SiO_2/Ta_2O_5/SiO_2$, $SiO_2/SiON/SiO_2$, $SiO_2/AlON/SiO_2$, $SiO_2/AlN/SiO_2$, or $SiO_2/Al_2O_3/SiO_2$. Preferably, the gate is formed of Al, W, Co, Ti or polysilicon, and the density of the trap sites is between $10^{10}/cm^2$ and $10^{15}/cm^2$.

To achieve the above object, there is provided a method of driving MNOS memory cells including a semiconductor substrate of a first conductivity type; a channel of an inversion layer formed on the semiconductor substrate; a source and a drain which are doped with a second conductivity type ($n^+$) and formed on the semiconductor substrate, having the channel therebetween; an oxide layer formed on the channel; a nitride layer formed on the oxide layer; a gate formed on the nitride layer; and trap sites which are formed between the oxide layer and the nitride layer to be charged with electrons, wherein the channel is formed to have a width that is smaller than or equal to the Debye screen length which is expressed by $L_D = (\in k_B T/q^2 N_A)^{1/2}$, wherein $\in$ denotes the dielectric constant of the substrate, $k_B$ denotes Boltzmann's constant, T denotes absolute temperature, q denotes charge, and $N_A$ denotes the concentration of impurities in the substrate, in a state where the gates of the memory cells are connected to each other via a word line, the drains of the memory cells are connected to each other via a bit line, and a sense amplifier is connected to the bit line. The method includes a writing step where electrons are tunneled in the channels by channel hot electron injection, so the trap sites are charged with less than several thousands of electrons, by applying a voltage of 15 V or less to the word line and setting the voltage difference between the drain and the source to be 5 V or less. Also, the method includes a reading step where, with a voltage of less than 5V applied to the word line and a voltage of 2V or less applied between the source and the drain, if the trap sites are charged with electrons, the memory registers an off state and no current flows, and otherwise, the memory registers an on state and current flows, and this phenomenon is detected by the sense amplifier.

In the present invention, it is preferable that the writing step is performed by performing FNT on the electrons in the substrate and charging the trap sites with less than several thousands of electrons by opening the source and the drain and applying a voltage of 15 V or less to the word line.

To achieve the above object, there is provided a method of driving MONOS memory cells including a semiconductor substrate of a first conductivity type; a channel of an inversion layer formed on the semiconductor substrate; a source and a drain which are doped with a second conductivity type ($n^+$) and formed on the semiconductor substrate, having the channel therebetween; a first oxide layer formed on the channel; a nitride layer formed on the first oxide layer; a second oxide layer formed on the nitride layer; a gate formed on the second oxide layer; and trap sites which are formed between the first oxide layer and the nitride layer to be charged with electrons, wherein the channel is formed to have a width that is smaller than or equal to the Debye screen length, which is expressed by $L_D = (\in k_B T/q^2 N_A)^{1/2}$ wherein $\in$ denotes the dielectric constant of the substrate, $k_B$ denotes Boltzmann's constant, T denotes absolute temperature, q denotes charge, and $N_A$ denotes the concentration of impurities in the substrate, in a state where the gates of the memory cells are connected to each other via a word line, the drains of the memory cells are connected to each other via a bit line, and a sense amplifier is connected to the bit line. The method includes a writing step where electrons are tunneled in the channels by channel hot electron injection, so the trap sites are charged with less than several thousands of electrons, by applying a voltage of 15 V or less to the word line and setting the voltage difference between the drain and the source to be 5 V or less. Also, the method includes a reading step where with a voltage of less than 5V applied to the word line and a voltage of 2V or less applied between the source and the drain, if the trap sites are charged with electrons, the memory registers an off state and no current flows, and otherwise, the memory registers an on state and current flows, and this phenomenon is detected by the sense amplifier.

In the present invention, it is preferable that the writing step is performed by performing FNT on the electrons in the substrate and charging the trap sites with less than several thousands of electrons by opening the source and the drain and applying a voltage of 15 V or less to the word line. Preferably, the writing step is repeated at regular intervals to prevent the writing state from being erased.

BRIEF DESCRIPTION OF THE DRAWINGS

The above object and advantages of the present invention will become more apparent by describing in detail preferred embodiments thereof with reference to the attached drawings in which.

DESCRIPTION OF THE PREFERRED EMBODIMENTS

A non-volatile metal nitride oxide semiconductor (MNOS) type memory according to the present invention has almost the same structure as the structures of existing MNOS and metal oxide nitride oxide semiconductor (MONOS) memories. Similar to the existing MNOS and MONOS (SONOS) memories, the present invention performs writing by storing electrons in trap sites, and performs reading using a threshold voltage variation which is caused by the electrons. However, the present invention is essentially different from existing memories in that only one trapped electron can cause a variation in threshold voltage by setting the width of a channel to be smaller than or equal to the Debye screen length. When this operating principle and structure are applied, the scaling limit of existing MNOS or MONOS memories can be overcome, and a memory can be maintained by even less than several thousands of electrons, in contrast to existing MNOS or MONOS memories which require several tens of thousands of electrons to preserve themselves. Thus, super low power consuming, ultra-highly integrated memories can be realized due to the small number of electrons.

Figure 1A:
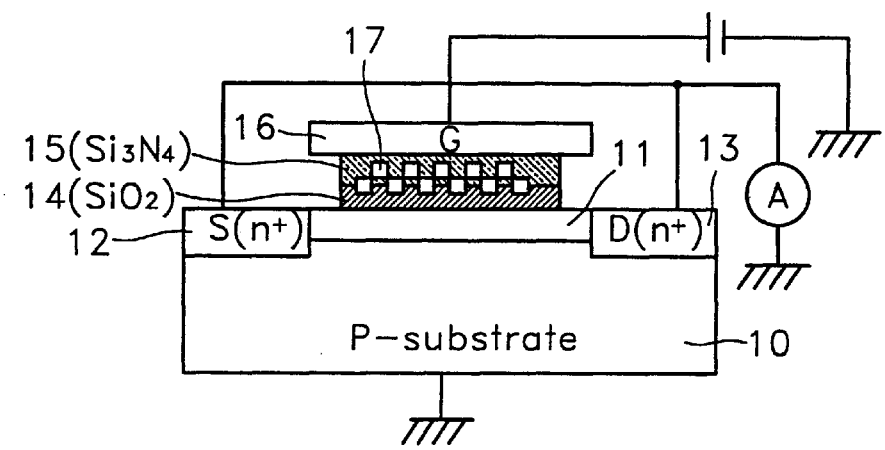
FIG. 1A is a schematic cross-sectional view of a metal nitride oxide semiconductor (MNOS) memory representative of conventional non-volatile memories.
Figure 1B:
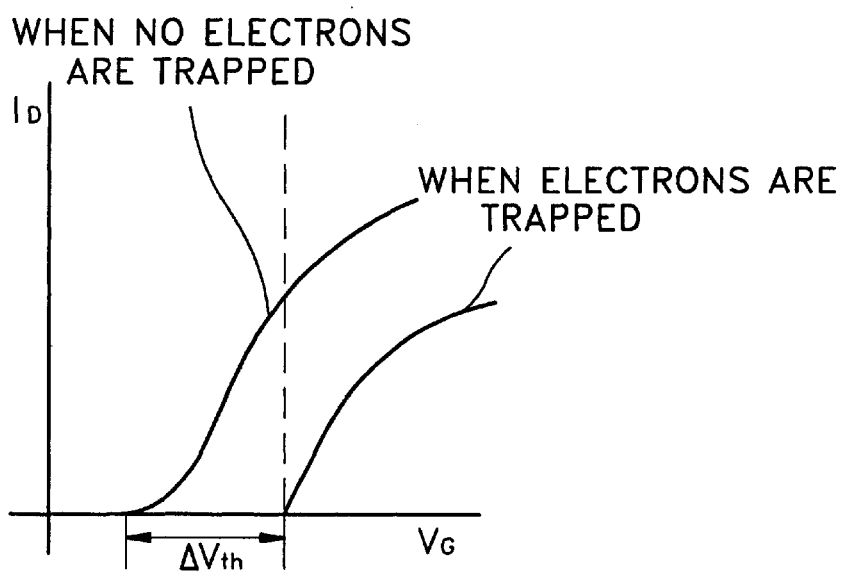
FIG. 1B is a graph showing current-voltage (I–V) characteristic curves of the non-volatile MNOS memory of FIG. 1A.
Figure 2A:
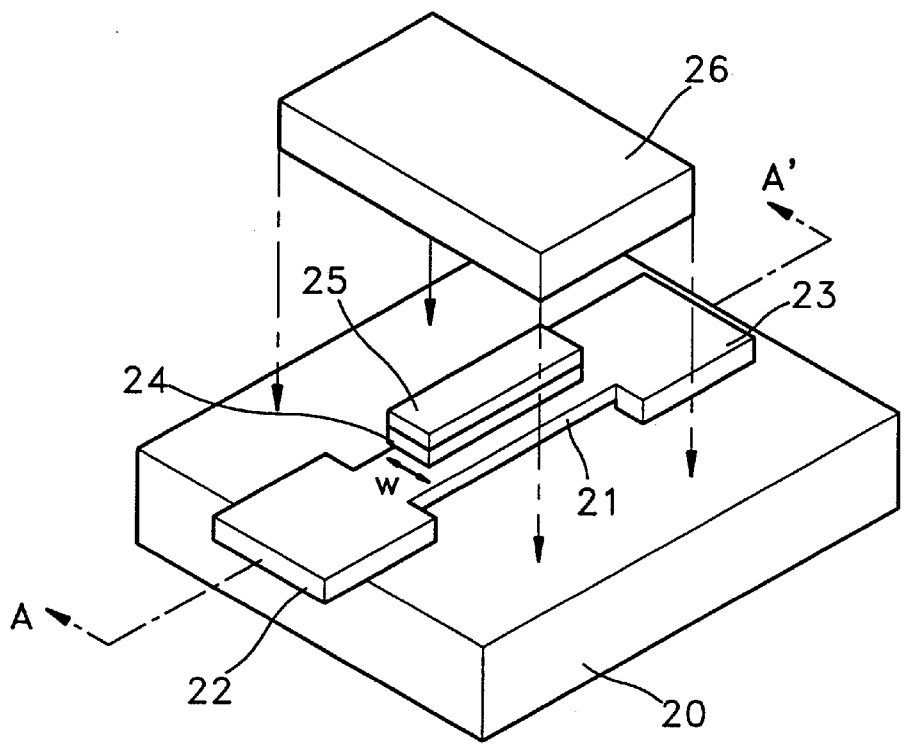
FIG. 2A is an exploded perspective view of an MNOS memory according to the present invention, which illustrates a channel region in greater detail.
Figure 2B:
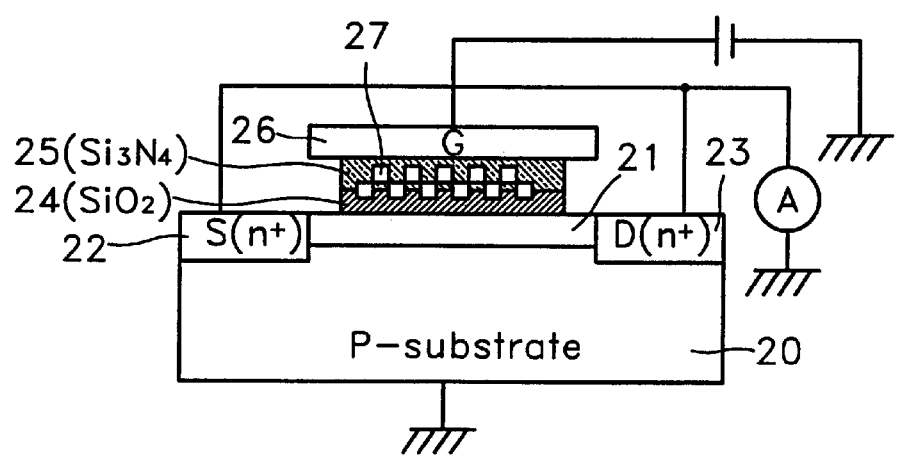
FIG. 2B is a vertical cross-sectional view of the MNOS memory of FIG. 2A, taken along line A–A'.

FIG. 2A is an exploded perspective view of an MNOS memory according to the present invention, which illustrates a channel region in greater detail. FIG. 2B is a vertical cross-sectional view of the MNOS memory of FIG. 2A taken along line A–A'. As shown in FIGS. 2A and 2B, in the non-volatile MNOS memory according to the present invention, a source 22 and a drain 23, which are doped with $n^+$, are formed on a p-type semiconductor substrate 20, having a channel 21 of an inversion layer therebetween. A tunnel oxide layer 24 composed of $SiO_2$ and a thin nitride layer 25 composed of $Si_3N_4$ are sequentially formed on the channel 21, and then a gate 26 is formed on the resultant structure. Trap sites 27, which are charged with electrons, are formed between the tunnel oxide layer 24 and the thin nitride layer 25 which are stacked between the channel 21 and the gate 26. As described above, the non-volatile MNOS memory according to the present invention is the same as existing MNOS memories in basic structure. However, the width of the channel 21 is smaller than or equal to the Debye screen length, in contrast to existing MNOS memories. Thus, the MNOS memory according to the present invention requires less than several thousands of electrons to store information corresponding to a digital 0 or 1, unlike an existing MNOS memory where several ten thousands of electrons are stored in the trap sites 17.

An MNOS memory having such a configuration is fabricated by a method that is similar to a commonly-known method of fabricating a field effect transistor (FET). When the MNOS memory is fabricated, the concentration of impurities in the Si substrate 20 is $10^{13}$ to $10^{17}/cm^3$, the Debye screen length $L_D$ is determined depending on the concentration of impurities in the substrate, and the width of the channel is set to be smaller than or equal to the Debye screen length $L_D$. The $NO(Si_3N_4/SiO_2)$ layer (24+25) stacked between the gate (M) 26 and the channel (S) 21, which are materials for making a memory device, can be replaced with several combinations of dielectric materials, such as, $TiO_2/SiO_2$, $Ta_2O_5/SiO_2$, $SiON/SiO_2$, $AlON/SiO_2$, $AlN/SiO_2$, or $Al_2O_3/SiO_2$. Dielectric combinations, which are charged with electrons, are formed by chemical vapor deposition (CVD) or physical vapor deposition (PVD). Then, resist is coated, and the width of the channel is made smaller than or equal to the Debye screen length $L_D$ through a direct mapping using electron beams, or photolithography and etching. Next, the gate is formed. The metal (M) for forming the gate may be one of Al, W, Co, Ti, and Poly-silicon (conductive semiconductor; doped with p-type or n-type impurities). The selected metal is deposited by CVD or PVD. Then, resist is coated on the deposited metal layer, and the gate is formed through a direct mapping using electron beams, or photolithography and etching. The thus-formed MNOS memory sets a deposition condition that the trap site density should be $10^{10}$ to $10^{15}/cm^2$. A channel hot electron (CHE) method or Fowler-Nordheim (F-N) method is used as a writing method. Here, the thickness of an oxide becomes 10 nm or less. In order to increase the speed of writing, the oxide layer 24 is formed of a natural oxide, a thermal oxide or a dielectric material having a high permittivity (a dielectric constant of 4 or greater), to have a valid equivalent thickness of 1.5 nm or less which allows only direct tunneling to occur. In order to achieve driving with a low power consumption, the thickness of the nitride layer 25 is reduced to 100 nm or less, or the electric field is drastically reduced by applying a dielectric film having a high permittivity (a dielectric constant of 4 or greater).

Figure 3:
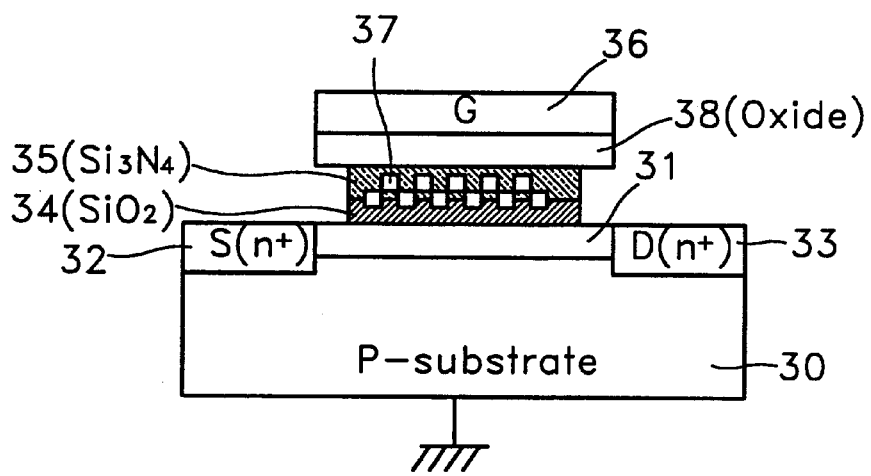
FIG. 3 is a vertical cross-sectional view of a metal oxide nitride oxide semiconductor (MONOS) memory according to the present invention.

FIG. 3 is a vertical cross-sectional view of a metal oxide nitride oxide semiconductor (MONOS) memory according to the present invention. As shown in FIG. 3, in the non-volatile MONOS memory according to the present invention, a source 32 and a drain 33, which are doped with $n^+$, are formed on a p-type semiconductor substrate 30, having a channel 31 of an inversion layer therebetween. A tunnel oxide layer 34 composed of $SiO_2$ and a thin nitride layer 35 composed of $Si_3N_4$ are sequentially formed on the channel 31, and then an oxide layer 38 and a gate 36 are sequentially formed on the resultant structure. Trap sites 37, which are charged with electrons, are formed between the tunnel oxide layer 34 and the thin nitride layer 35 which are stacked between the channel 31 and the gate 36. As described above, the non-volatile MONOS memory according to the present invention is the same as existing MONOS memories in basic structure. However, the width of the channel 31 is smaller than or equal to a Debye screen length, in contrast to existing MONOS memories. Thus, the MONOS memory according to the present invention requires less than several thousands of electrons to store information corresponding to a digital 0 or 1, unlike existing MNOS memories where several tens of thousands of electrons are stored in trap sites.

A MONOS memory having such a configuration is fabricated by a method that is similar to a commonly-known FET fabrication method. When the MONOS memory is fabricated, the concentration of impurities in the Si substrate 30 is $10^{10}$ to $10^{15}/cm^3$, the Debye screen length $L_D$ is determined depending on the concentration of impurities in the substrate 30, and the width of the channel is determined to be smaller than or equal to the Debye screen length $L_D$. An ONO($SiO_2/Si_3N_4/SiO_2$) layer (34+35+38) between the gate (M) 36 and the channel (S) 31, which are materials for making a memory device, can be replaced with a combination of dielectric materials, such as, $SiO_2/TiO2/SiO_2$, $SiO_2/Ta_2O_5/SiO_2$, $SiO_2/SiON/SiO_2$, $SiO_2/AlON/SiO_2$, $SiO_2/AlN/SiO_2$, or $SiO_2/Al_2O_3/SiO_2$. Dielectric combinations, which are charged with electrons, are formed by CVD or PVD. Then, resist is coated, and the width of the channel is made smaller than or equal to the Debye screen length $L_D$ through a direct mapping using electron beams, or photolithography and etching.

Next, the gate is formed. The metal (M) for forming the gate may be one of Al, W, Co, Ti, and Poly-silicon (conductive semiconductor; doped with p-type or n-type impurities). The selected metal is subjected to CVD or PVD. Then, resist is coated, and the gate is formed through a direct mapping using electron beams, or photolithography and etching. The thus-formed MONOS memory sets a deposition condition that the trap site density should be $10^{10}$ to $10^{15}/cm^2$. A channel hot electron (CHE) method or Fowler-Nordheim (F-N) method is used as a writing method. Here, the thickness of an oxide becomes 10 nm or less. In order to increase the speed of writing, the oxide layer 34 is formed of a natural oxide, a thermal oxide or a dielectric material having a high permittivity (a dielectric constant of 3.5 or greater), to have a valid equivalent thickness of 1.5 nm or less which allows only direct tunneling to occur. In order to achieve driving with a low power consumption, the thickness of the nitride layer 35 is reduced to 10 nm or less, or an electric field is reduced drastically by applying a dielectric film having a high permittivity (a dielectric constant of 3.5 or greater) and reducing the thickness of the oxide layer 38 to 100 nm or less.

The operating principle of the MNOS type (MNOS and MONOS) memories fabricated to have the above-described structures will now be described.

The present invention is based on the principle that a channel can be screened by even a single electron stored in trap sites by reducing the width of the channel to a Debye screen length or narrower. This serves to increase the reliability of MNOS-type memories and achieve minimum power consumption, superhigh speed (nsec) operation and ultrahigh integration. The Debye screen length is expressed as in the following Equation 1:

$$L_D = (\in k_B T/q^2 N_A)^{1/2} \quad (1)$$

wherein $\in$ denotes the dielectric constant of the substrate, $k_B$ denotes Boltzmann's constant, T denotes the absolute temperature, q denotes the charge, and $N_A$ denotes the concentration of impurities in the substrate.

| Concentration of impurities in substrate (NA); $cm^{-3}$ | Debye screen length ($L_D$); nm |
|---|---|
| $4 \times 10^{18}$ | 2 |
| $10^{16}$ | 42 |
| $10^{15}$ | 130 |
| $10^{14}$ | 420 |
| $10^{13}$ | 1300 |

As can be seen from the above table, the screening length of an electron varies with the concentration of impurities in a substrate. Hence, assuming that LD is 100 nm, when the impurity concentration of a substrate is set within a range of $10^{15}$ to $10^{16}$ $cm^{-3}$ the width of a channel in this case can be set to be 100 nm or narrower. When a single electron is stored in a trap site after the channel width has been set as described above, the single electron screens the channel, causing $\Delta Vtn$ as expressed in the following Equation 2:

$$\Delta Vtn = nq \, (t_n + t_0 \in_n / \in_0) / \in_n \quad (2)$$

wherein n denotes the trap density, which is usually $10^{11}$ to $10^{14}/cm^2$, $t_n$ denotes the thickness of the nitride layer, and to denotes the thickness of the oxide layer. $\in_0$ and $\in_n$ denote the dielectric constant of the oxide and the dielectric constant of the nitride, respectively. If the trap density is $10^{13}/cm^2$, and the valid thickness is 3.5 nm, $\Delta Vtn$ caused by one electron per trap reaches 1.5 Volts, which means that the sub-threshold current can be reduced several tens of times. That is, by reducing the channel width to the Debye screen length, the charging effect of a single electron can be used in a memory. Also, by appropriately controlling the impurity concentration of the substrate, ultrahighly integrated memories can be realized, even without the use of nano technology. Furthermore, trap sites formed during deposition act as the nano crystals of IBM, even though nano crystals are not formed artificially as in the product of IBM, so that the charging effect by a single electron can be sufficiently utilized by only reducing the channel width to the Debye screen length or so. If a memory is fabricated to have a channel having a 180 nm length and a 100 nm width, 1800 electrons are required upon writing, so that low consumption of power is possible. However, upon writing using direct tunneling, the retention time is expected to be shorter than those in other memories, so refresh must be performed after a certain period of time. Upon writing, when a voltage of less than 15 V is applied to a gate connected to a word line (i.e., a gate line), and the voltage difference between a drain and a source is set to be less than 5V, electrons tunnel into the channel of a transistor by channel hot electron injection (CHEI), so less than several thousands of electrons are charged in trap sites. On the other hand, if a voltage of less than 15V is applied to the gate connected to a word line while a source and a drain are open, less than several thousands of electrons in a substrate are charged in trap sites by FNT. Upon reading, a voltage of less than 5V is applied to the gate and a voltage of 2V or less is applied between the source and the drain. In this case, if the trap sites are charged with electrons, the memory registers an off state and no current flows. Otherwise, the memory registers an on state and current flows. A voltage swing caused by this current is detected by a sense amplifier A which is connected along a bit line.

Figure 4:
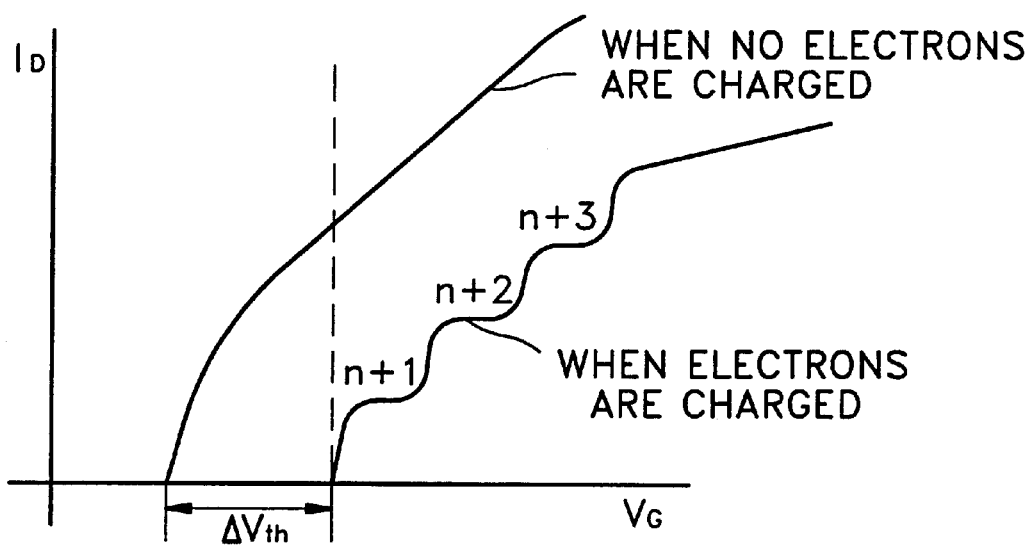
FIG. 4 is a graph showing typical current-voltage (I–V) characteristic curves of a memory according to the present invention.

FIG. 4 is a graph showing typical current-voltage (I–V) characteristic curves of a memory according to the present invention. If trap sites are not charged with electrons, a generally-well-known FET I–V characteristic curve is shown. On the other hand, if trap sites are charged with electrons, a Coulomb staircase, which is a typical IV characteristic of a single electron transistor, is also shown together with a change in the threshold voltage. In the latter case, the I–V characteristic of a single electron being charged in each trap site is shown.

As described above, the MNOS (MONOS) memory according to the present invention using single electron charging has an important characteristic in that since it uses trap sites having the same effect as nano particles without forming nano particles, a threshold voltage variation $\Delta Vtn$ is caused by single electron charging if the width of the channel is reduced to the Debye screen length or narrower.

Therefore, in contrast to floating gate type SET flash memories which require the manufacture of nano particles or a nano-sized floating gate, the MNOS (MONOS) memory according to the present invention can apply existing FET techniques without modification, thus providing easy ultra-high integration (16 G or more) and high reliability.

General NVROMs (flash memories, EEPROMs, and EPROMs) must store several tens of thousands of electrons in trap sites to represent a digital 0. However, the memory according to the present invention can maintain a digital 0 with less than several thousands of electrons, and thus can greatly reduce power consumption. That is, the power consumption P is expressed as in the following Equation 3:

$$P=cv^2=Qvf=nqvf \qquad (3)$$

wherein c denotes a capacitance, v denotes operation voltage, f denotes frequency, Q denotes charge, n denotes the number of electrons, and q denotes the charge of an electron.

As can be seen from Equation 3, the MNOS type memory according to the present invention requires electrons, the number of which is smaller by more than an order of magnitude than the number of electrons required by existing NVROMs, to preserve their memory states. Accordingly, it finds by simple calculation that the power consumption required to maintain a digital 0 can be reduced several tens of times per cell. Consequently, there are no problems caused by heat generated by the operation of the memory. Thus, the MNOS type memory according to the present invention does not have any of the thermal problems which occur in existing highly integrated NVROMs, so that integration up to the range of Terabits (Tb) is possible.

Also, the MNOS type memory according to the present invention is operated by less than several thousands of electrons, and so can drastically shorten the writing and erasing time, compared to existing NVROMs. Thus, a fast operation on the order of nsec is possible. Furthermore, the MNOS type memory according to the present invention does not require wiring cutting for preventing electromigration, since the number of electrons flowing on a wire is less than that in existing NVROMs. In particular, the MNOS type memory according to the present invention has no degradation of elements due to the hot carrier effect, since electrons are charged in trap sites by direct tunneling.

Therefore, the present invention is applicable to ultra-highly integrated flash memories, ultrahighly integrated EEPROMs and EPROMs, DRAMs, integrated EEPROMs or EPROMs, DRAMs, SRAMs and others.

What is claimed is:

1. A metal nitride oxide semiconductor (MNOS) memory comprising:

a semiconductor substrate of a first conductivity type;

a channel of an inversion layer formed on the semiconductor substrate;

a source and a drain which are doped with a second conductivity type and formed on the semiconductor substrate, having the channel therebetween;

an oxide layer formed on the channel;

a nitride layer formed on the oxide layer;

a gate formed on the nitride layer; and trap sites which are formed between the oxide layer and the nitride layer to be charged with electrons one by one, wherein the channel is formed to have a width that is smaller than or equal to the Debye screen length which is expressed by the following equation:

$$L_D = (\in k_B T/q^2 N_A)^{1/2}$$

wherein $\in$ denotes the dielectric constant of the substrate, $k_B$ denotes Boltzmann's constant, T denotes absolute temperature, q denotes charge, and $N_A$ denotes the concentration of impurities in the substrate.

2. The MNOS memory of claim 1, wherein the semiconductor substrate of a first conductivity type is a p-type silicon substrate, and the second conductive type is an $n^+$ type.

3. The MNOS memory of claim 2, wherein the impurity concentration $N_A$ of the p-type semiconductor substrate is within $10^{17}$ to $10^{13}/cm^3$.

4. The MNOS memory of claim 3, wherein a combination of a nitride constituting the nitride layer and an oxide constituting the oxide layer is selected from the group consisting of $Si_3N_4/SiO_2$, $TiO_2/SiO_2$, $Ta_2O_5/SiO_2$, $SiON/SiO_2$, $AlON/SiO_2$, $AlN/SIO_2$, and $Al_2O_3/SiO_2$.

5. The MNOS memory of claim 2, wherein the oxide layer maintains a thickness of 10 nm or less to achieve Fowler-Nordheim tunneling (FNT) writing or channel hot electron injection (CHEI) writing, and is formed of a natural oxide, a thermal oxide or a high dielectric material having a dielectric constant of 3.5 or more, to have a thickness of 1.5 nm or less when only direct tunneling must occur in order to increase writing speed.

6. The MNOS memory of claim 5, wherein a combination of a nitride constituting the nitride layer and an oxide constituting the oxide layer is selected from the group consisting of $Si_3N_4/SiO_2$, $TiO_2/SiO_2$, $Ta_2O_5/SiO_2$, $SiON/SiO_2$, $AlON/SiO_2$, $AlN/SIO_2$, and $Al_2O_3/SiO_2$.

7. The MNOS memory of claim 2, wherein the nitride layer is formed to have a thickness of 100 nm or less, or is formed of a dielectric material having a dielectric constant of 3.5 or greater.

8. The MNOS memory of claim 2, wherein a combination of a nitride constituting the nitride layer and an oxide constituting the oxide layer is selected from the group consisting of $Si_3N_4/SiO_2$, $TiO_2/SiO_2$, $Ta_2O_5/SiO_2$, $SiON/SiO_2$, $AlON/SiO_2$, $AlN/SIO_2$, and $Al_2O_3/SiO_2$.

9. The MNOS memory of claim 2, wherein the gate is formed of a material selected from the group consisting of Al, W, Co, Ti and polysilicon.

10. The MNOS memory of claim 2, wherein the density of the trap sites is between $10^{10}/cm^2$ and $10^{15}/cm^2$.

11. The MNOS memory of claim 1, wherein the density of the trap sites is between $10^{10}/cm^2$ and $10^{15}/cm^2$.

12. A metal oxide nitride oxide semiconductor (MONOS) memory comprising:

a semiconductor substrate of a first conductivity type;

a channel of an inversion layer formed on the semiconductor substrate;

a source and a drain which are doped with a second conductivity type and formed on the semiconductor substrate, having the channel therebetween;

a first oxide layer formed on the channel;

a nitride layer formed on the first oxide layer;

a second oxide layer formed on the nitride layer;

a gate formed on the second oxide layer; and trap sites which are formed between the first oxide layer and the nitride layer to be charged with electrons one by one, wherein the channel is formed to have a width that is smaller than or equal to the Debye screen length which is expressed by the following equation:

$$L_D = (\in k_B T/q^2 N_A)^{1/2}$$

wherein $\in$ denotes the dielectric constant of the substrate, $k_B$ denotes Boltzmann's constant, T denotes absolute temperature, q denotes charge, and $N_A$ denotes the concentration of impurities in the substrate.

13. The MONOS memory of claim 12, wherein the semiconductor substrate of a first conductivity type is a p-type silicon substrate, and the second conductive type is an $n^+$ type.

14. The MONOS memory of claim 13, wherein the impurity concentration $N_A$ of the p-type semiconductor substrate is within $10^{17}$ to $10^{13}/cm^3$.

15. The MONOS memory of claim 14, wherein a combination of oxide constituting the first oxide layer, nitride constituting the nitride layer and oxide constituting the second oxide layer is a combination selected from the group consisting of $SiO_2/Si_3N_4/SiO_2$, $SiO_2/TiO_2/SiO_2$, $SiO_2/Ta_2O_5/SiO_2$, $SiO_2/SiON/SiO_2$, $SiO_2/AlON/SiO_2$, $SiO_2/AlN/SiO_2$, and $SiO_2/Al_2O_3/SiO_2$.

16. The MONOS memory of claim 13, wherein the first oxide layer maintains a thickness of 10 nm or less to achieve Fowler-Nordheim tunneling (FNT) writing or channel hot electron injection (CHEI) writing, and is formed of a natural oxide, a thermal oxide or a dielectric material having a dielectric constant of 3.5 or more, to have a thickness of 1.5 nm or less so that only direct tunneling can occur in order to increase writing speed.

17. The MONOS memory of claim 16, wherein a combination of oxide constituting the first oxide layer, nitride constituting the nitride layer and oxide constituting the second oxide layer is a combination selected from the group consisting of $SiO_2/Si_3N_4/SiO_2$, $SiO_2/TiO_2/SiO_2$, $SiO_2/Ta_2O_5/SiO_2$, $SiO_2/SiON/SiO_2$, $SiO_2/AlON/SiO_2$, $SiO_2/AlN/SiO_2$, and $SiO_2/Al_2O_3/SiO_2$.

18. The MONOS memory of claim 13, wherein the nitride layer is formed to have a thickness of 100 nm or less, or is formed of a dielectric material having a dielectric constant of 3.5 or greater, and the second oxide layer is formed to have a thickness of 100 nm or less.

19. The MONOS memory of claim 13, wherein a combination of oxide constituting the first oxide layer, nitride constituting the nitride layer and oxide constituting the second oxide layer is a combination selected from the group consisting of $SiO_2/Si_3N_4/SiO_2$, $SiO_2/TiO_2/SiO_2$, $SiO_2/Ta_2O_5/SiO_2$, $SiO_2/SiON/SiO_2$, $SiO_2/AlON/SiO_2$, $SiO_2/AlN/SiO_2$, and $SiO_2/Al_2O_3/SiO_2$.

20. The MONOS memory of claim 13, wherein the gate is formed of a material selected from the group consisting of Al, W, Co, Ti and polysilicon.

21. The MONOS memory of claim 13, wherein the density of the trap sites is between $10^{10}/cm^2$ and $10^{15}/cm^2$.

22. The MONOS memory of claim 12, wherein the density of the trap sites is between $10^{10}/cm^2$ and $10^{15}/cm^2$.

23. A method of driving MNOS memory cells including a semiconductor substrate of a first conductivity type; a channel of an inversion layer formed on the semiconductor substrate; a source and a drain which are doped with a second conductivity type ($n^+$) and formed on the semiconductor substrate, having the channel therebetween; an oxide layer formed on the channel; a nitride layer formed on the oxide layer; a gate formed on the nitride layer; and trap sites which are formed between the oxide layer and the nitride layer to be charged with electrons, wherein the channel is formed to have a width that is smaller than or equal to the Debye screen length which is expressed by $L_D=(\in k_B T/q^2 N_A)^{1/2}$, wherein $\in$ denotes the dielectric constant of the substrate, $k_B$ denotes Boltzmann's constant, T denotes absolute temperature, q denotes charge, and $N_A$ denotes the concentration of impurities in the substrate, in a state where the gates of the memory cells are connected to each other via a word line, the drains of the memory cells are connected to each other via a bit line, and a sense amplifier is connected to the bit line, the method comprising:

a writing step where electrons are tunneled in the channels by channel hot electron injection, so the trap sites are charged with less than several thousands of electrons, by applying a voltage of 15 V or less to the word line and setting the voltage difference between the drain and the source to be 5 V or less; and a reading step where, with a voltage of less than 5V applied to the word line and a voltage of 2V or less applied between the source and the drain, if the trap sites are charged with electrons, the memory registers an off state and no current flows, and otherwise, the memory registers an on state and current flows, and this phenomenon is detected by the sense amplifier.

24. The method of claim 23, wherein the writing step is performed by performing FNT on the electrons in the substrate and charging the trap sites with less than several thousands of electrons by opening the source and the drain and applying a voltage of 15 V or less to the word line.

25. The method of claim 24, where the writing step is repeated at regular intervals to prevent the writing state from being erased.

26. The method of claim 23, where the writing step is repeated at regular intervals to prevent the writing state from being erased.

27. A method of driving MONOS memory cells including a semiconductor substrate of a first conductivity type; a channel of an inversion layer formed on the semiconductor substrate; a source and a drain which are doped with a second conductivity type ($n^+$) and formed on the semiconductor substrate, having the channel therebetween; a first oxide layer formed on the channel; a nitride layer formed on the first oxide layer; a second oxide layer formed on the nitride layer; a gate formed on the second oxide layer; and trap sites which are formed between the first oxide layer and the nitride layer to be charged with electrons, wherein the channel is formed to have a width that is smaller than or equal to the Debye screen length, which is expressed by $L_D=(\in k_B T/q^2 N_A)^{1/2}$, wherein $\in$ denotes the dielectric constant of the substrate, $k_B$ denotes Boltzmann's constant, T denotes absolute temperature, q denotes charge, and $N_A$ denotes the concentration of impurities in the substrate, in a state where the gates of the memory cells are connected to each other via a word line, the drains of the memory cells are connected to each other via a bit line, and a sense amplifier is connected to the bit line, the method comprising:

a writing step where electrons are tunneled in the channels by channel hot electron injection, so the trap sites are charged with less than several thousands of electrons, by applying a voltage of 15 V or less to the word line and setting the voltage difference between the drain and the source to be 5 V or less; and a reading step where with a voltage of less than 5V applied to the word line and a voltage of 2V or less applied between the source and the drain, if the trap sites are charged with electrons, the memory registers an off state and no current flows, and otherwise, the memory registers an on state and current flows, and this phenomenon is detected by the sense amplifier.

28. The method of claim 27, wherein the writing step is performed by performing FNT on the electrons in the substrate and charging the trap sites with less than several thousands of electrons by opening the source and the drain and applying a voltage of 15 V or less to the word line.

29. The method of claim 28, where the writing step is repeated at regular intervals to prevent the writing state from being erased.

30. The method of claim 27, where the writing step is repeated at regular intervals to prevent the writing state from being erased.

* * * * *